(12) United States Patent
von Malm

(10) Patent No.: US 10,461,120 B2
(45) Date of Patent: Oct. 29, 2019

(54) DISPLAY DEVICE AND METHOD FOR PRODUCING A DISPLAY DEVICE

(71) Applicant: OSRAM Opto Semiconductors GmbH, Regensburg (DE)

(72) Inventor: Norwin von Malm, Nittendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/663,936

(22) Filed: Jul. 31, 2017

(65) Prior Publication Data

US 2017/0352700 A1     Dec. 7, 2017

Related U.S. Application Data

(63) Continuation of application No. 15/147,499, filed on May 5, 2016, now Pat. No. 9,748,309, which is a (Continued)

(30) Foreign Application Priority Data

Dec. 22, 2011  (DE) ........................ 10 2011 056 888

(51) Int. Cl.
*H01L 27/15*     (2006.01)
*H01L 33/38*     (2010.01)
(Continued)

(52) U.S. Cl.
CPC .......... *H01L 27/156* (2013.01); *H01L 27/124* (2013.01); *H01L 27/1259* (2013.01);
(Continued)

(58) Field of Classification Search
CPC ....... H01L 27/156; H01L 33/50; H01L 33/05; H01L 27/15
See application file for complete search history.

(56) References Cited

U.S. PATENT DOCUMENTS

| 5,789,766 A | 8/1998 | Huang et al. |
|---|---|---|
| 5,893,721 A | 4/1999 | Huang et al. |

(Continued)

FOREIGN PATENT DOCUMENTS

| CN | 101960601 A | 1/2011 |
|---|---|---|
| CN | 102117821 A | 7/2011 |

(Continued)

OTHER PUBLICATIONS

Day, J., et al., "III-Nitride full-scale high-resolution microdisplays," Applied Physics Letters, vol. 99, No. 3, Jul. 22, 2011, 3 pages.
(Continued)

*Primary Examiner* — Elias Ullah
(74) *Attorney, Agent, or Firm* — Slater Matsil, LLP

(57) ABSTRACT

A display device with a semiconductor layer sequence includes an active region provided for generating radiation and a plurality of pixels. The display device also includes a carrier. The active region is arranged between a first semiconductor layer and a second semiconductor layer. The semiconductor layer sequence includes a recess, which extends from a major face of the semiconductor layer sequence facing the carrier through the active region into the first semiconductor layer and is provided for electrical contacting of the first semiconductor layer. The carrier includes a number of switches, which are each provided for controlling at least one pixel.

20 Claims, 6 Drawing Sheets

Related U.S. Application Data continuation of application No. 14/367,821, filed as application No. PCT/EP2012/075080 on Dec. 11, 2012, now Pat. No. 9,362,335.

(51) Int. Cl.

| | | |
|---|---|---|
| *H01L 33/20* | (2010.01) | |
| *H01L 33/00* | (2010.01) | |
| *H01L 33/50* | (2010.01) | |
| *H01L 27/12* | (2006.01) | |
| *H01L 33/62* | (2010.01) | |

(52) U.S. Cl.
CPC ............ *H01L 27/15* (2013.01); *H01L 33/005* (2013.01); *H01L 33/20* (2013.01); *H01L 33/382* (2013.01); *H01L 33/50* (2013.01); *H01L 33/62* (2013.01); *H01L 33/505* (2013.01); *H01L 2933/0066* (2013.01)

(56) References Cited

U.S. PATENT DOCUMENTS

| | | | |
|---|---|---|---|
| 8,450,751 | B2 | 5/2013 | Engl et al. |
| 8,577,218 | B2 | 11/2013 | von Malm et al. |
| 8,643,034 | B2 | 2/2014 | Engl et al. |
| 8,643,040 | B2 | 2/2014 | Lee et al. |
| 8,710,537 | B2 | 4/2014 | Engl et al. |
| 8,716,724 | B2 | 5/2014 | von Malm et al. |
| 9,362,335 | B2 | 6/2016 | von Malm |
| 2011/0156064 | A1 | 6/2011 | Seo et al. |
| 2011/0210362 | A1 | 9/2011 | Lee et al. |
| 2011/0241031 | A1 | 10/2011 | von Malm et al. |
| 2011/0254034 | A1 | 10/2011 | Konsek et al. |
| 2012/0086026 | A1 | 4/2012 | Engl et al. |
| 2014/0098556 | A1 | 4/2014 | von Malm et al. |
| 2015/0028754 | A1* | 1/2015 | Siessegger ......... H05B 33/0803 315/186 |

FOREIGN PATENT DOCUMENTS

| | | |
|---|---|---|
| DE | 102008011848 A1 | 9/2009 |
| DE | 102008062933 A1 | 7/2010 |
| DE | 102009047788 A1 | 3/2011 |
| EP | 2341543 A1 | 7/2011 |
| JP | 2002141492 A | 5/2002 |
| JP | 2011513957 A | 4/2011 |
| JP | 2011139038 A | 7/2011 |
| JP | 2011527519 A | 10/2011 |
| JP | 2011528855 A | 11/2011 |
| KR | 20100134581 A | 12/2010 |
| KR | 101039610 B1 | 6/2011 |
| KR | 20110099753 A | 9/2011 |
| WO | 2009106063 A1 | 9/2009 |
| WO | 2010072191 A1 | 7/2010 |

OTHER PUBLICATIONS

Liu, Z. J., et al., "P-34: Active Matrix Programmable Monolithic Light Emitting Diodes on Silicon (LEDoS) Displays," SID Symposium Digest of Technical Papers, vol. 42, Issue 1, Aug. 16, 2012, pp. 1215-1218.

McKendry, J.J.D., et al., "Individually Addressable AlInGaN Micro-LED Arrays With CMOS Control and Subnanosecond Output Pulses," IEEE Photonics Technology Letters, vol. 21, No. 12, Jun. 15, 2009, 3 pages.

* cited by examiner

DISPLAY DEVICE AND METHOD FOR PRODUCING A DISPLAY DEVICE

This is a continuation of U.S. patent application Ser. No. 15/147,499, filed on May 5, 2016, which is a continuation of U.S. patent application Ser. No. 14/367,821, filed on Jun. 20, 2014 (now U.S. Pat. No. 9,362,335 B2), which is a national phase filing under section 371 of PCT/EP2012/075080, filed Dec. 11, 2012, which claims the priority of German patent application 10 2011 056 888.3, filed Dec. 22, 2011, each of which is incorporated herein by reference in its entirety.

TECHNICAL FIELD

A display device and a method for producing a display device are provided.

BACKGROUND

LED display devices with a small number of pixels may be driven by the multiplexing method, in which for each pixel one contact per row and one contact per column is passed out and supplied to a controller. In this method the pixels can only be driven one after the other, which results in ever higher currents through the pixel in the case of an increasing number of pixels for flicker-free overall display device brightness.

SUMMARY

Embodiments of the invention provide a display device that allows images to be generated with high resolution and a high refresh rate. In addition, a method is provided with which a display device can be efficiently and simply produced.

According to one embodiment, a display device comprises a semiconductor layer sequence, which comprises an active region provided for generating radiation and forms a plurality of pixels. The display device further comprises a carrier. The active region is arranged between a first semiconductor layer and a second semiconductor layer, wherein the first semiconductor layer and the second semiconductor layer conveniently comprise different conduction types. The semiconductor layer sequence comprises at least one recess, which extends from a major face, facing the carrier, of the semiconductor layer sequence through the active region into the first semiconductor layer and is provided for electrical contacting of the first semiconductor layer. The carrier comprises a plurality of switches, which are provided in each case for controlling at least one pixel.

Precisely one switch is preferably associated with each pixel. When the display device is in operation, each pixel can be driven by means of the assigned switch. When in operation, a plurality of pixels can thus be driven simultaneously, in particular all the pixels can be driven simultaneously.

During production of the display device, the pixels preferably arise from a common semiconductor layer sequence, i.e., the semiconductor layers, in particular the active regions of the individual pixels, are identical with regard to their material composition and their layer thicknesses, apart from production-related variations which occur laterally over a semiconductor wafer.

In a preferred embodiment a semiconductor layer sequence growth substrate is removed completely or at least in places or is thinned throughout or at least in places. The carrier may stabilize the semiconductor layer sequence mechanically, which means that the growth substrate is no longer needed for this purpose. The display device is preferably completely free of the growth substrate. The risk of optical crosstalk between adjacent pixels when the display device is in operation can thus be reduced. In contrast thereto, however, it may also be sufficient for the growth substrate merely to be thinned to a given residual thickness.

In one preferred configuration the display device comprises a first connection layer, which is connected electrically conductively with the first semiconductor layer in the at least one recess. The first connection layer may be arranged between the semiconductor layer sequence and the carrier. The first semiconductor layer can be electrically contacted from the side of the semiconductor layer sequence facing the carrier by means of the first connection layer. Furthermore, a second connection layer is preferably arranged between the carrier and the semiconductor layer sequence, this being electrically conductively connected in places with the second semiconductor layer. At least one electrically conductively connected region of the second connection layer preferably completely encloses the at least one recess laterally. The first connection layer and/or the second connection layer or at least one sublayer are preferably reflective for radiation to be generated in the active region when in operation. The reflectivity for the radiation generated in the active region preferably amounts to at least 50%, particularly preferably at least 70%.

In plan view onto the display device, the first connection layer and the second connection layer may overlap. The second connection layer may moreover be arranged in places between the semiconductor layer sequence and the first connection layer. Alternatively, the first connection layer and the second connection layer may be arranged without overlap. The first connection layer and/or the second connection layer may moreover furthermore be of single-layer or multilayer construction. With a multilayer construction in particular, the first connection layer and/or the second connection layer may contain a TCO (Transparent Conductive Oxide) material.

One of the connection layers may form a common electrical contact for the pixels, for example, the first connection layer may form a common electrical contact for the first semiconductor layer and the second semiconductor layer of the pixels may be connected electrically conductively by means of the second connection layer in each case with one of the switches, or vice versa. With a common electrical contact for a plurality of pixels, in particular for all the pixels, the total number of contacts required for the pixels may be reduced.

In one variant configuration the active region extends continuously across a plurality of pixels, in particular across all the pixels. The active region is thus of continuous construction and is perforated only by the at least one recess. Thus, an additional production step of dividing the active region for the individual pixels may be dispensed with.

In an alternative variant configuration the active region is subdivided into a plurality of segments, which each form one pixel.

Subdivision between adjacent pixels may be brought about in each case, for example, by means a trench, which divides at least the active region. In particular, the trench may divide the entire semiconductor layer sequence.

Alternatively, the trench may also be formed only in the first semiconductor layer, i.e., the trench does not divide the active region. Such a trench may improve optical separation between the pixels, without the active region being divided.

During production the segments arise from a common semiconductor layer sequence. The composition and layer thicknesses of the semiconductor layer sequence of the segments are thus identical apart from manufacturing-related variations during epitaxial deposition.

Through subdivision into segments, separation of charge carrier injection between adjacent pixels may achieved in a simplified manner.

In one configuration the at least one recess extends at least in places along the circumference of a segment. In particular, the recess may completely surround the segment. By means of the recess, the individual pixels may be electrically contacted along their circumference, in particular along their entire circumference, for example, by means of the first connection layer. The first connection layer may be arranged between adjacent pixels in the region of the recess and take the form of a lattice, for example. The first connection layer in particular forms a common electrical contact for the first semiconductor layer of the segments.

In one further development a side face of at least one segment, in particular the side faces of a plurality or all of the segments, comprises a projection which extends parallel or substantially parallel, for instance at an angle of at most 10°, to the radiation exit face of the display device and in which the first semiconductor layer is electrically contacted. In particular, in the region of the projection the first connection layer adjoins the first semiconductor layer.

In a further configuration, the first semiconductor layer of one pixel is electrically conductively connected with the second semiconductor layer of an adjoining pixel. These adjoining pixels are thus connected together electrically in series.

In one preferred further development, the switch is connected electrically conductively on one side with the first semiconductor layer and on another side with the second semiconductor layer of the pixel. The associated pixel may thus be electrically bypassed by means of the switch. Thus, even with electrical series connection of one or more pixels the individual pixels can be individually driven. Preferably, each of the series-connected pixels comprises a switch for electrical bypassing.

The number of recesses may in particular be varied within broad limits depending on the intended application of the display device and the size of the individual pixels. In a configuration, in particular, in which the first semiconductor layer extends continuously across all the pixels, just one recess may be sufficient for the entire display device. A single recess is also sufficient in the case of a recess formed in the manner of a lattice between the individual pixels. For uniform current input in the lateral direction, i.e., in a direction extending in a main plane of extension of the semiconductor layers of the semiconductor layer sequence 2, a plurality of recesses is preferably provided, however, as a function of the transverse conductivity of the first semiconductor layer. The number of recesses is preferably at least as great as the number of pixels. This may be the case both in a configuration in which the first semiconductor layer is connected to a switch via the first connection layer and in a configuration in which the first connection layer extends continuously across the pixels. In particular, two or more recesses per pixel may also be convenient if the lateral extent of the individual pixels is comparatively great. Laterally uniform charge carrier injection into the active region of the pixel is thus simplified.

In a preferred configuration, a radiation conversion element is arranged on a side of the semiconductor layer sequence remote from the carrier. The radiation conversion element is preferably provided to convert at least some of the radiation with a first peak wavelength generated in the active region into secondary radiation with a second peak wavelength different from the first peak wavelength.

The radiation conversion element may extend continuously across a plurality of pixels, in particular across all the pixels. Alternatively, the radiation conversion element may comprise a plurality of segments, each of which is associated with at least one pixel. For example, in each case three or more pixels may be combined into a color triplet, which is provided to generate radiation in the red, green and blue spectral ranges. Such a display device is suitable for full-color reproduction of still or moving images.

In a method for producing a display device with a plurality of pixels, a semiconductor layer sequence is provided which comprises an active region provided for generating radiation. A land is formed on the semiconductor layer sequence for each pixel. A carrier with a plurality of switches is provided. The semiconductor layer sequence is positioned in such a way relative to the carrier that a land is associated with each switch. An electrically conductive connection is produced between the lands and the switches. A growth substrate for the semiconductor layer sequence is removed completely or in places.

The method does not necessarily have to be performed in the sequence listed above.

Removal of the growth substrate preferably takes place after the production of an electrically conductive connection between the lands and the switch. In this case, removal of the growth substrate thus takes place only once the pixels of the display device have already been connected with the associated switches of the carrier.

Alternatively, the semiconductor layer sequence may also be provided on an auxiliary carrier other than the growth substrate and serving as an intermediate carrier. The auxiliary carrier may serve to stabilize the semiconductor layer sequence mechanically before the carrier is fixed to the semiconductor layer sequence and assumes this task. Once the semiconductor layer sequence is fixed to the carrier, the auxiliary carrier can be removed.

Furthermore, production of a plurality of display devices preferably proceeds simultaneously in a wafer assembly, wherein a plurality of display devices are produced by singulation of the wafer assembly, for example, by sawing or by means of a laser separation method. Singulation into the display devices preferably proceeds only after production of an electrically conductive connection between the lands and the switches and particularly preferably only after removal of the growth substrate for the semiconductor layer sequence.

The above-described method is particularly suitable for producing a display device described further above. Features listed in connection with the display device may therefore also be used for the method and vice versa.

BRIEF DESCRIPTION OF THE DRAWINGS

Further features, configurations and convenient aspects are revealed by the following description of the exemplary embodiments in conjunction with the figures, in which.

Identical, similar or identically acting elements are provided with the same reference numerals in the figures.

The figures and the size ratios of the elements illustrated in the figures relative to one another are not to be regarded as being to scale. Rather, individual elements may be illustrated on an exaggeratedly large scale for greater ease of depiction and/or better comprehension.

DETAILED DESCRIPTION OF ILLUSTRATIVE EMBODIMENTS

Figure 1:
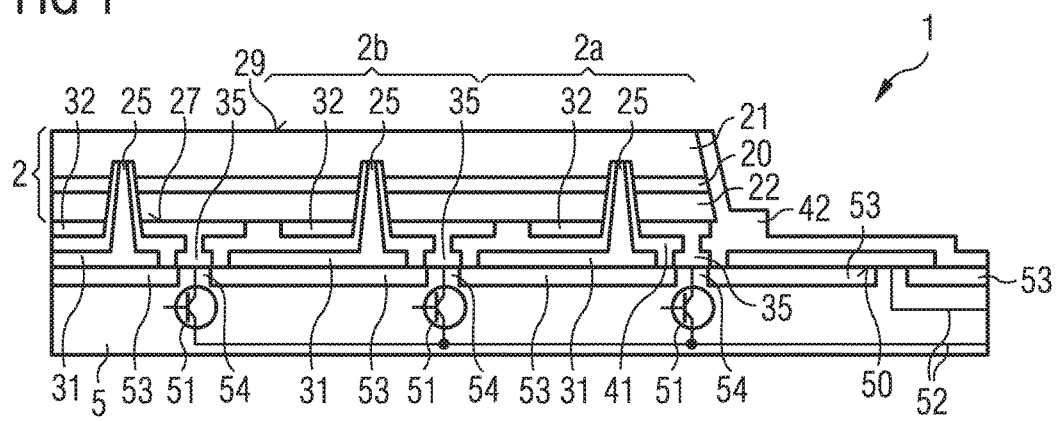
FIGS. 1 to 7 are each schematic sectional views of an exemplary embodiment of a display device.

FIG. 1 is a schematic sectional view of a first exemplary embodiment of a display device 1. The display device comprises a plurality of pixels, which are arranged next to one another, in particular in the manner of a matrix. To simplify the illustration, a portion of the display device with a first pixel 2a and a second pixel 2b is shown in the figure.

The display device 1 comprises a semiconductor layer sequence 2. The semiconductor layer sequence comprises an active region 20 provided for generating radiation, which region extends vertically between a major face 27 and a radiation exit face 29. The active region is arranged between a first semiconductor layer 21 of a first conduction type and a second semiconductor layer 22 of a second conduction type different from the first conduction type. For example, the first semiconductor layer may be n-conductive and the second semiconductor layer p-conductive or vice versa. In the semiconductor layer sequence 2 a plurality of recesses 25 is formed, which extend from the major face through the second semiconductor layer 22 and the active region 20 into the first semiconductor layer 21.

The active region 20 may be provided to generate radiation in the visible spectral range, in the ultraviolet spectral range or in the infrared spectral range. In particular, the active region may comprise a quantum well structure, for example, a multi quantum well structure.

The semiconductor layer sequence 2, in particular the active region 20, preferably comprises a III-V compound semiconductor material. The semiconductor material may in particular contain at least one group III element from the group consisting of Ga, Al and In and at least one group V element from the group consisting of N, P and As.

III-V compound semiconductor materials are particularly suitable for producing radiation in the ultraviolet ($Al_xIn_yGa_{1-x-y}N$) through the visible ($Al_xIn_yGa_{1-x-y}N$, in particular for blue to green radiation, or $Al_xIn_yGa_{1-x-y}P$, in particular for yellow to red radiation) as far as into the infrared ($Al_xIn_yGa_{1-x-y}As$) range of the spectrum. Here in each case $0 \leq x \leq 1$, $0 \leq y \leq 1$ and $x+y \leq 1$ applies, in particular with $x \neq 1$, $y \neq 1$, $x \neq 0$ and/or $y \neq 0$. Using III-V semiconductor materials, in particular from the stated material systems, high internal quantum efficiencies in the generation of radiation may additionally be achieved.

The display device 1 further comprises a carrier 5, on which the semiconductor layer sequence 2 is arranged and fixed. A plurality of switches 51, which may, for example, take the form of an individual transistor or a circuit with a plurality of transistors and capacitors, is integrated into the carrier 5. On a major face 50 of the carrier 5 facing the semiconductor layer sequence 2, a contact region 54 is associated with each of the switches 51, which contact region is provided for electrical connection with the pixels 2a, 2b of the semiconductor layer sequence. An insulating region 53 which isolates the contact regions 54 electrically from one another is formed in each case between adjacent contact regions 54 on the major face 50. In addition, feed lines 52 are formed in the carrier 5, via which the pixels of the display device can be driven via an electrical control circuit.

The carrier 5 may, for example, take the form of a silicon carrier, the switches 51 being formed, for instance, using CMOS (Complementary Metal Oxide Semiconductor) technology. In addition to the switches 51, the carrier may also comprise further electronic components for driving the display device 1, for example, a shift register or a programmable logic module.

In addition to electrical drive of the pixels 2a, 2b, the carrier 5 also serves to stabilize the semiconductor layer sequence 2 mechanically. A growth substrate for preferably epitaxial deposition of the semiconductor layer sequence is no longer needed for this purpose and may therefore be removed during production of the display device.

Furthermore, the semiconductor layer sequence is also connected thermally conductively with the carrier 5, such that the waste heat generated when in operation can be efficiently dissipated via the carrier. Suitable ways of producing the connection are, for example, soldering, for instance soldering using paste solder, silver sintering, a direct bonding method or contacting using bumps, wherein an underfill may be provided between the bumps to increase mechanical stability.

For electrical connection of the pixels 2a, 2b of the semiconductor layer sequence 2 with the carrier 5, a first connection layer 31 and a second connection layer 32 are arranged between the semiconductor layer sequence 2 and the carrier 5. The first connection layer 31 extends through the recesses 25 and is provided for electrical contacting of the first semiconductor layer 21. The second connection layer 32 is accordingly provided for electrical contacting of the second semiconductor layer 22 and directly adjoins the second semiconductor layer. The connection layers are preferably metallic and moreover are preferably reflective to the radiation generated in the active region 20. Silver is, for example, distinguished by a particularly high reflectivity in the visible and ultraviolet spectral ranges. Another metal may alternatively also be used, for example, aluminum, nickel, gold, rhodium or palladium or a metal alloy with at least one of the stated materials, for example, a silver-palladium alloy or Au:Ge.

The connection layers 31, 32 may also be of multilayer construction. In the case of a multilayer configuration, a sublayer of the connection layers 31, 32 may also contain a TCO material, for example, indium-tin oxide (ITO) or zinc oxide.

In plan view onto the display device 1 the first connection layer 31 and the second connection layer 32 overlap in places. The second connection layer 32 may thus directly adjoin the second semiconductor layer 22 in a comparatively large region and thus reflect the greater part of the radiation emitted towards the carrier 5 by the active region 20, such that this fraction of the radiation may exit through the radiation exit face 29. In the exemplary embodiment shown, the second connection layer 32 forms a land 35 for each pixel 2a, 2b, these being connected to the contact region 54 of the associated switch 51. The first semiconductor layer 21 is electrically contacted continuously by means of the first connection layer 31, such that the first connection layer forms a common contact for all the pixels 2a, 2b of the display device and is directly connected with a feed line 52.

The common contact may be connected to a feed line 52 at one or more points or be guided directly out of the display device 1.

A first insulation layer 41, for example, a silicon oxide layer, is arranged between the first connection layer 31 and the second connection layer 32. The insulation layer serves for electrical insulation between the first connection layer 31 and second connection layer 32 and for electrical insulation of the first connection layer from the second semiconductor layer 22 and the active region 20 in the region of the recesses 25. The side faces of the semiconductor layer sequence 2, in particular the active region 20, are covered with a second insulation layer 42.

When the display device 1 is in operation, the pixels 2a, 2b may be operated mutually independently and in particular simultaneously by means of the switches 51. In contrast to a configuration in which the pixels are connected using contact lines in rows and columns, the number of pixels may thereby be increased, without the switching times per pixel at a given refresh rate having to be reduced for this purpose. The current through the pixels thus does not need to be increased to achieve the same pixel brightness.

In the exemplary embodiment shown, the semiconductor layer sequence 2 extends continuously across the pixels 2a, 2b. The active region 20 thus takes the form of a contiguous region. The lateral extent of a pixel results in this exemplary embodiment substantially from the lateral extent of the second connection layer 32.

The number of recesses 25 may be varied within broad limits as a function of the size of the pixels and the transverse conductivity of the first semiconductor layer. Unlike in the exemplary embodiment shown, it is thus not necessary for each pixel to have its own recess 25 or even a plurality of its own recesses 25. Instead, a plurality of pixels arranged adjacent one another may also comprise a common recess 25. In an extreme case, a single recess may be sufficient for the entire display device.

The edge length of the individual pixels 2a, 2b may be varied within wide ranges. For example, the edge length may amount to between 1 µm and 1 mm inclusive. To form a pixel headlight, for example, for an adaptive front lighting system (AFS) in a motor vehicle, the edge length is, for example, preferably between 20 µm and 150 µm inclusive. For a projection display, the edge length preferably amounts to between 1 µm and 5 µm inclusive.

The non-emitting spaces between adjacent pixels may amount to between 0.5 µm and 20 µm inclusive.

Particularly suitable materials for a connection between the pixels 2a, 2b and the contact regions 54 of the carrier 5 are a metal, for example, gold, silver, copper or nickel, or a metal alloy comprising at least one of the stated materials, for example, gold-tin, copper-silver-tin, indium-tin or nickel-tin.

The second exemplary embodiment, illustrated schematically in FIG. 2, corresponds substantially to the first exemplary embodiment described in connection with FIG. 1. In contrast thereto, the second connection layer 32 forms a common contact for all the pixels 2a, 2b of the display device 1. The first connection layers 31 in each case form the lands 35, which are electrically conductively connected with the switches 51 assigned to the respective pixel.

Furthermore, a radiation conversion element 6 is formed on the radiation exit face 29 of the semiconductor layer sequence. In the exemplary embodiment shown the radiation conversion element takes the form of a contiguous element, comprising a plurality of segments 6a, 6b. Precisely one segment is assigned to each pixel. A separating web 61 is formed between each pair of neighboring segments. The separating webs allow the segments 6a, 6b to be insulated optically from one another. Optical separation between the pixels 2a, 2b is increased in this way.

For a display device which is intended to reproduce full-color still or moving images, the segments 6a, 6b may be provided to generate radiation with a secondary wavelength with mutually different peak wavelengths. For example, three segments 6a, 6b may form a color triplet for generating radiation in the red, green and blue spectral ranges. It goes without saying that is also feasible for the radiation conversion element 6 to be of non-contiguous construction and for the radiation conversion element to be applied to the respective pixels 2a, 2b in the form of individual segments separated mechanically from one another.

The radiation conversion element 6 may be fixed in premanufactured form to the radiation exit face 29 or formed directly on the radiation exit face. Furthermore, the radiation conversion element may, for example, be formed by means of ceramic particles, quantum dots or organic molecules. These may be embedded in a matrix material, for example, a polymer matrix material, for instance a silicone or an epoxy or a hybrid material with a silicone and an epoxy. Alternatively the radiation conversion element may also take the form of a ceramic radiation conversion element, in which the particles alone provided for radiation conversion form a ceramic, for example, by sintering or are assembled into a ceramic with the assistance of further substances.

For a pixel headlight the segments 6a, 6b of the radiation conversion element 6 may also be of identical construction. The segments may, for example, be provided for radiation conversion of blue radiation generated in the active region 20 into secondary radiation in the yellow spectral range, such that light which appears white to the human eye is emitted.

The third exemplary embodiment, illustrated schematically in FIG. 3, corresponds substantially to the second exemplary embodiment described in connection with FIG. 2. At variance therewith, adjacent pixels 2a, 2b are separated from one another by means of a trench 26. The trench extends from the radiation exit face 29 at least through the active region, preferably through the entire semiconductor layer sequence 2. The trenches allow the pixels 2a, 2b to be separated from one another optically and electrically in simplified manner. For purely optical separation of the pixels, the trenches may also extend solely from the radiation exit face 29 into the first semiconductor layer 21, without dividing the active region 20. Such trenches may also be used with a contiguous first semiconductor layer 21, as described, for example, in connection with FIG. 1.

The side faces of the trenches are covered with the second insulation layer 42. The trenches 26 may be unfilled or filled with a filler material. The filler material may be transmissive, absorbent or reflective for the radiation generated in the active region 20. An absorbent or reflective filler material allows the optical separation between adjacent pixels to be increased. An example of a suitable transparent or absorbent filler material for the trenches is a dielectric material, for instance a polymer material. The reflective material may take the form of a metal layer or a plastics material filled with reflective particles, for example, titanium oxide. When a dielectric material is used as filler material, the second insulation layer 42 on the side faces of the trenches 26 may also be dispensed with.

In the exemplary embodiment shown, the radiation conversion element 6 takes the form of a contiguous element, which extends across the pixels 2a, 2b. The radiation conversion element may in particular be of one-piece construction. It goes without saying that a radiation conversion element embodied as described in relation to FIG. 2 may also be used. The radiation conversion elements 6 described in relation to FIGS. 2 and 3 are generally suitable for the display devices described in relation to all the exemplary embodiments, even if these are not shown explicitly in all the exemplary embodiments for the sake of simplicity.

Figure 2:
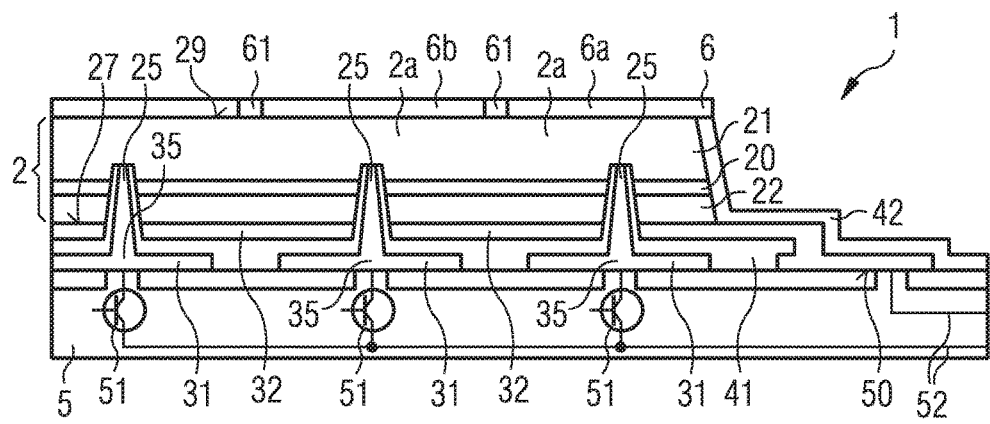
Figure 3:
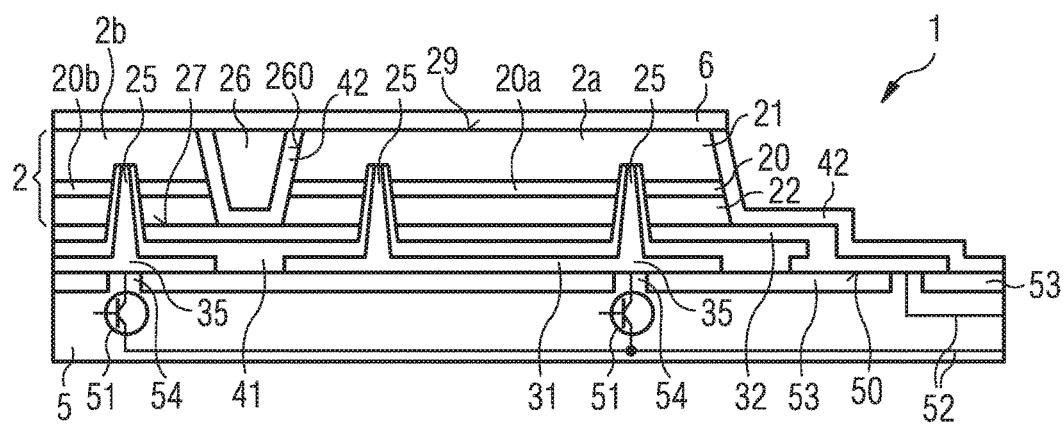

Furthermore, unlike in the exemplary embodiment shown in FIG. 2, a pixel 2a comprises a plurality of recesses 25 for contacting the first semiconductor layer 21.

A plurality of recesses per pixel are particularly suitable for display devices with comparatively large pixels 2a, 2b, for example, in a display device for a pixel head light.

The exemplary embodiment illustrated in FIG. 4 corresponds substantially to the exemplary embodiment described in connection with FIG. 3. Unlike in the latter, each pixel 2a, 2b has in each case precisely one recess 25. The size of the individual pixels and thus also the center distances between adjacent pixels can be minimized in this way. Such a display device 1 is suitable in particular as a light source for a projection display.

Figure 5:
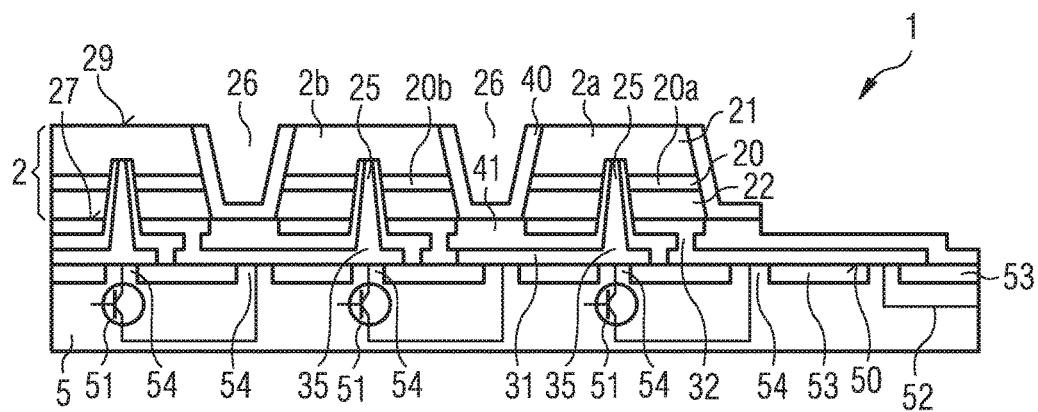

The fifth exemplary embodiment illustrated in FIG. 5 differs from the previous exemplary embodiments in particular in that the individual pixels 2a, 2b are connected together electrically in series, i.e., the first semiconductor layer 21 of the pixel 2a is electrically conductively connected via the connection layers 31, 32 to the second semiconductor layer 22 of the adjacent pixel 2b. The switch 51 is electrically conductively connected on the one side, for example, at a source terminal of a transistor, via the first connection layer 31 with the first semiconductor layer 21 and on the other side, for example, at a drain terminal of this transistor, via the second connection layer 32 with the second semiconductor layer 22. In the closed state of the switch the associated pixel is thus electrically short-circuited and thus does not emit any radiation. When the switch 51 is open, the charge carriers reach the active region 20 of this pixel and recombine there, emitting radiation. In other words switchable bypassing of the carrier 5 is associated with each pixel, such that the individual pixels 2a, 2b can be individually driven by means of the switches 51 despite the electrical series connection of the individual pixels. Such an interconnection allows the number of feed lines 52 needed to be reduced. Furthermore, the current flowing through the display device remains constant for all the pixels.

Figure 6:
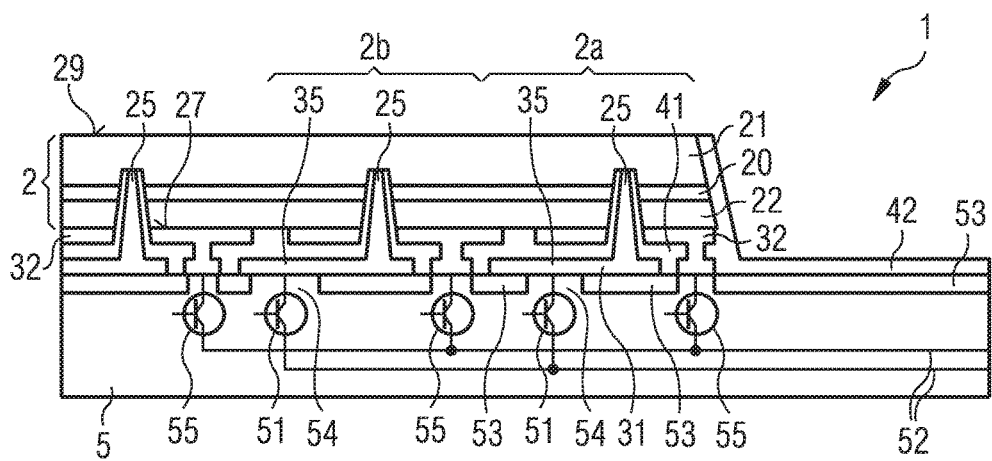

A sixth exemplary embodiment of a display device is shown schematically in FIG. 6. This sixth exemplary embodiment substantially corresponds to the first exemplary embodiment described in connection with FIG. 1. Unlike in the latter the first semiconductor layer 21 is connected for each pixel electrically via the first connection layer 31 in each case to a switch 51 and the second semiconductor layer 22 is connected for each pixel electrically via the second connection layer 32 in each case to a further switch 55. Two switches are thus associated with each pixel. The display device 1 thus does not have any common contact for the pixels. The pixels can be contacted completely independently of one another.

Figure 7:
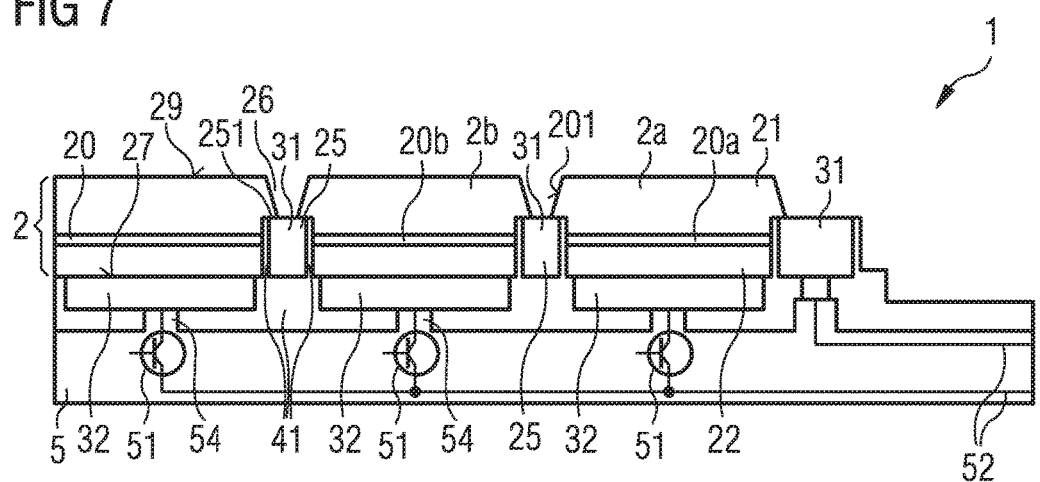

A seventh exemplary embodiment of a display device is shown schematically in FIG. 7. This seventh exemplary embodiment substantially corresponds to the fourth exemplary embodiment described in connection with FIG. 4.

Unlike in the latter, the first connection layer 31 forms a common electrical contact for the first semiconductor layer 21 of the pixels 2a, 2b. The second semiconductor layer 22 of the pixels is electrically conductively connected by means of the second connection layer in each case to one of the switches 51.

The recess 25, in which the first connection layer 31 is connected electrically conductively with the first semiconductor layer, extends along the circumference of each of the individual pixels 2a, 2b. The first connection layer arranged in the recess extends between adjacent pixels, when the display device 1 is viewed in plan view. Charge carrier injection into the first semiconductor layer 21 may thus proceed over the entire circumference of the individual pixels. To insulate the first connection layer 31 electrically from the active region 20 and from the second semiconductor layer 22, the insulation layer 41 covers the side faces 201 of the segments in places.

When the display device is viewed in plan view, the recess 25 for electrically contacting the first semiconductor layer 21 and the trenches 26 arranged between the pixels 2a, 2b overlap. Recesses for electrical contacting spaced laterally from the trenches are thus not needed.

Furthermore, the first connection layer 31 extends between the pixels 2a, 2b in the manner of a lattice. Undesired optical crosstalk between adjacent pixels is thus prevented or at least reduced. The first connection layer conveniently comprises at least one metal layer, which is opaque, in particular reflective, to the radiation generated when in operation.

The first connection layer 31 adjoins the first semiconductor layer 21 only at the side face 201 of the pixels 2a, 2b. The radiation exit face 29 is free of the first connection layer 31. Shading of the radiation exit face is thus prevented. In contrast thereto, the first connection layer may extend vertically as far as the radiation exit face and cover it in part. For example, the first connection layer may in each case be formed in the manner of a frame on the radiation exit face of the pixels. It is moreover also feasible for the first connection layer to comprise a radiation-transmissive sublayer, which is arranged over the entire radiation exit face and in the recess 25 adjoins the above-described radiation-opaque sublayer of the first connection layer. Large-area electrical contacting of the first semiconductor layer 21 is thus simplified.

In this exemplary embodiment the first connection layer 31 and the second connection layer 32 extend without overlap when the display device 1 is viewed in plan view. Electrical insulation between these layers can thus be achieved in simplified manner. An overlapping arrangement is however conceivable, providing these layers are insulated electrically from one another. The side faces 201 of the pixels 2a, 2b each have a projection 251. In the region of the projection the side face 201 extends parallel to the radiation exit face 29. In the region of the projection the cross-section of the pixels increases abruptly. The cross-section of the pixels is thus smaller at least in places on the side of the projection facing towards the carrier 5 than on the side of the projection facing away from the carrier. The first connection layer 31 adjoins the first semiconductor layer in the region of the projection. This increases the reliability of the electrical contacting of the first semiconductor layer 21. The projection 251 is formed by a base surface of the recess 25. Unlike the configuration with projection, the side face 201 of the pixels 2a, 2b may also extend continuously obliquely or perpendicular to the radiation exit face 29. The recess 25 may thus extend vertically completely through the semiconductor layer sequence, such that the recess simultaneously forms the trenches between the pixels.

Figure 4:
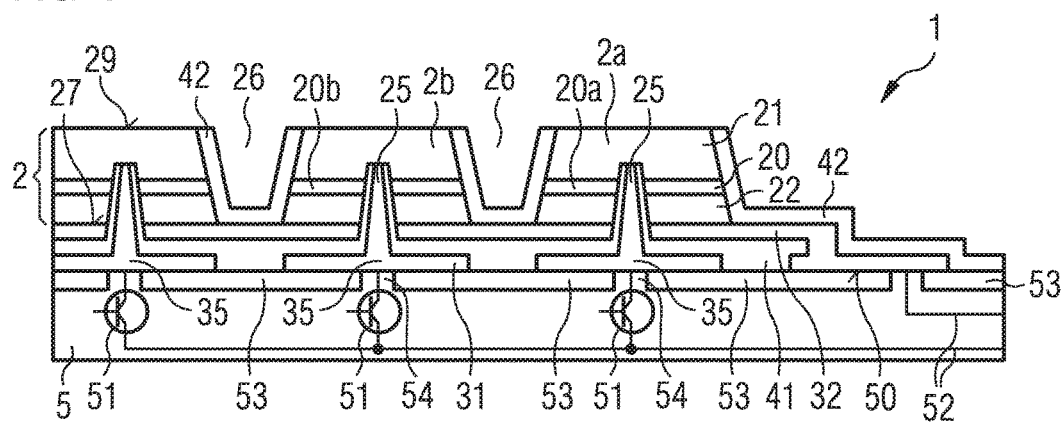

An exemplary embodiment of the production of a display device embodied as described in connection with FIG. 4 is described in connection with FIGS. 8A to 8D.

During production a plurality of display devices 1 may be produced next to one another in the wafer assembly and then singulated into individual display devices. For the sake of simplicity, in the figures in each case only a portion of a display device is shown.

Figure 8A:
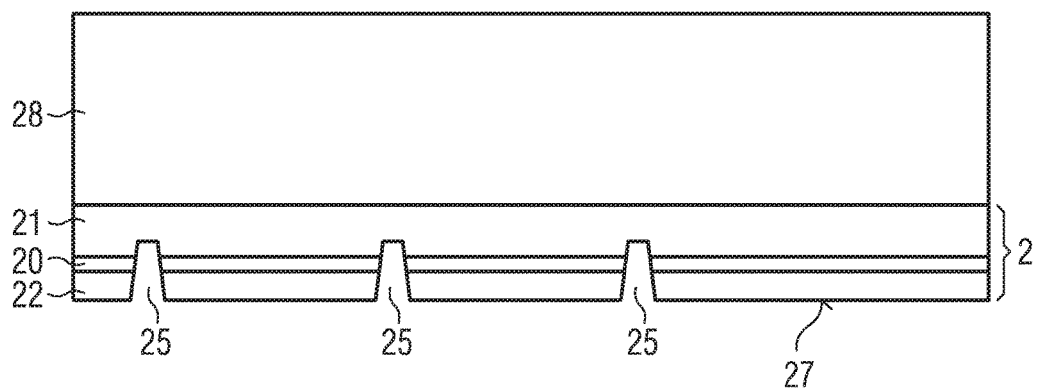
FIGS. 8A to 8D show an exemplary embodiment of a method for producing a display device using intermediate steps shown schematically in sectional view.

As shown in FIG. 8A, a semiconductor layer sequence 2 with an active region 20 provided for generating radiation and arranged between a first semiconductor layer 21 and a second semiconductor layer 22, is provided on an intermediate carrier 28. The intermediate carrier may in particular be a growth substrate for the semiconductor layer sequence. Depending on the material of the semiconductor layer sequence 2, examples of materials suitable as growth substrate are sapphire, silicon or gallium arsenide.

In contrast thereto, the intermediate carrier may also be an auxiliary carrier different from the growth substrate. In this case the growth substrate for the semiconductor layer sequence 2 has already been removed.

Figure 8B:
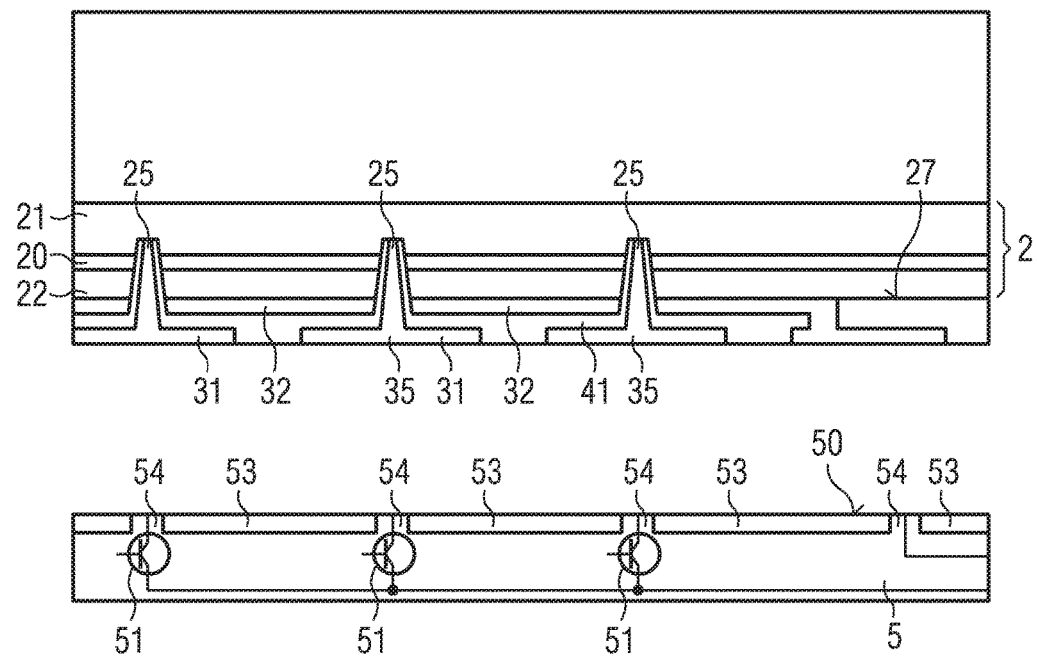

Starting from a major face 27 remote from the intermediate carrier 28, a plurality of recesses 25 is formed, which extend through the second semiconductor layer 22 and the active region 20 into the first semiconductor layer 21. Subsequently, as shown in FIG. 8B, on the premanufactured semiconductor layer sequence 2 a first connection layer 31 and a second connection layer 32 are formed on the major face which are provided for electrical contacting of the first semiconductor layer or the second semiconductor layer respectively. In the present case first of all the second connection layer 32 is formed. Then a first insulation layer 41 is applied, which in places covers the second connection layer 32 and the side faces of the recess 25. Then the first connection layer 31 is applied such that it is completely electrically insulated from the second connection layer 32 and adjoins the first semiconductor layer 21 in the region of the recess 25.

A carrier 5 is also provided, in which a plurality of switches 51 are provided. A contact region 54 on a major face 50 of the carrier 5 is associated with each of the switches 51.

In the exemplary embodiment shown the first connection layer 31 forms a land 35 serving to provide electrical contact with the respectively associated switch 51. In contrast, however, the second connection layer 32 may also form the lands 35, as described in relation to FIG. 1.

The semiconductor layer sequence 2 and the carrier 5 are positioned in such a way relative to one another that the lands 35 and the contact regions 54 overlap in plan view. On production of a connection between the semiconductor layer sequence 2 and the carrier 5, an electrically conductive, mechanically stable and moreover thermally conductive connection is thus produced between the lands 35 and the contact regions 54.

Figure 8C:
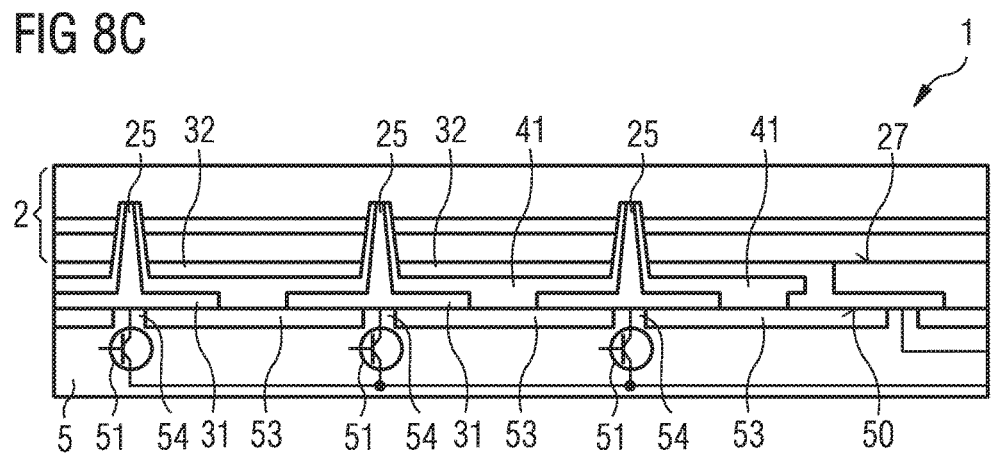

Once the connection has been produced between the semiconductor layer sequence and the carrier 5, it is possible, as shown in FIG. 8C, for the intermediate carrier 28, for example, the growth substrate, to be removed. Removal of the intermediate carrier, in particular of the growth substrate, may proceed, for example, mechanically, by means of grinding, chemically, for instance by means of etching, or using a laser lift-off (LLO) method.

Figure 8D:
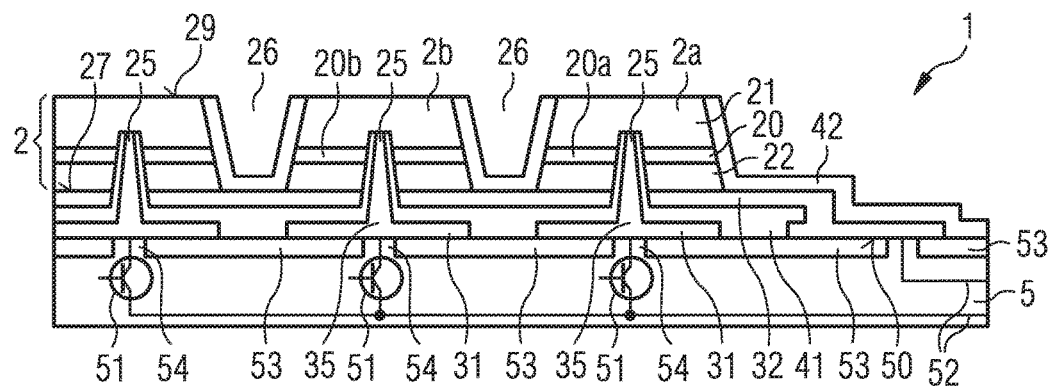

The pixels, as shown in FIG. 8D, may then be separated from one another by means of trenches 26. In contrast thereto, the trenches 26 may also be formed from the major face 27 before the semiconductor layer sequence is fixed to the carrier 5. To produce a display device as described in relation to FIG. 1, it is also possible to dispense with the formation of trenches.

Then the side faces of the semiconductor layer sequence 2, in particular the active region 20, are covered by means of a second insulation layer 42. If the second insulation layer exhibits sufficiently high optical transparency, said layer may also cover the radiation exit face 29, unlike in the described exemplary embodiment. Patterned application of the second insulation layer is not necessary in this case. To finish, the display devices may be singulated from the wafer assembly, for example, mechanically, for instance by sawing, chemically, for instance by wet chemical or dry chemical etching, or using a laser separation method.

Using the method described, display devices can be produced simply and reliably in which the pixels 2a, 2b can be individually driven when the display device is in operation. The number of pixels may be increased with such a display device without thereby reducing the operating time of the individual pixel. Due to the good micro-structurability of semiconductor layer sequences, it is possible to achieve particularly small pixels and small spacing between the pixels. Connection of the individual pixels 2a, 2b with the associated switches 51 may moreover still take place in the wafer assembly. As an alternative to production in which a semiconductor layer sequence for a plurality of display devices and a carrier for a plurality of display devices are connected together and then singulated, it is also possible for a semiconductor layer sequence already singulated into a plurality of semiconductor chips, said semiconductor chips each comprising a plurality of pixels 2a, 2b, to be transferred onto a carrier for one or more display devices and connected electrically conductively therewith.

The display device is further distinguished by a particularly compact design in which the switches have already been incorporated into the carrier which stabilizes the semiconductor layer sequence mechanically.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or the exemplary embodiments.

What is claimed is:

1. A pixel headlight comprising:
   a carrier; and
   a semiconductor layer sequence having a major face facing the carrier, the semiconductor layer sequence comprising a first semiconductor layer, a second semiconductor layer, and an active region arranged between the first semiconductor layer and the second semiconductor layer, the active region adapted to generate radiation and form a plurality of pixels;
   wherein the semiconductor layer sequence comprises a recess that extends from the major face of the semiconductor layer sequence through the active region into the first semiconductor layer and is provided for electrical contacting of the first semiconductor layer; and
   wherein the carrier comprises a plurality of switches that are integrated into the carrier, each switch provided for controlling at least one pixel.

2. The pixel headlight according to claim 1, wherein the pixel headlight is adapted for an adaptive front lighting system.

3. The pixel headlight according to claim 1, wherein an edge length of a pixel is between 20 μm and 150 μm inclusive.

4. The pixel headlight according to claim 1, further comprising a radiation conversion element arranged on a side of the semiconductor layer sequence remote from the carrier.

5. The pixel headlight according to claim 4, wherein the radiation conversion element extends contiguously across a plurality of the pixels.

6. The pixel headlight according to claim 4, wherein the radiation conversion element comprises a plurality of segments, at least one pixel being associated with each segment, wherein the segments of the radiation conversion element are of identical construction.

7. The pixel headlight according to claim 4, wherein the pixel headlight is configured so that light which appears white to the human eye is emitted during operation of the pixel headlight.

8. The pixel headlight according to claim 1, wherein the semiconductor layer sequence is a semiconductor layer sequence of the type grown on a growth substrate that is subsequently removed and wherein the carrier mechanically stabilizes the semiconductor layer sequence.

9. The pixel headlight according to claim 1, further comprising a first connection layer that is electrically conductively connected with the first semiconductor layer in the recess, and a second connection layer that is electrically conductively connected in places with the second semiconductor layer, wherein the first and second connection layers are arranged between the semiconductor layer sequence and the carrier.

10. The pixel headlight according to claim 9, wherein the first connection layer and the second connection layer overlap in plan view onto the pixel headlight.

11. The pixel headlight according to claim 9, wherein the first connection layer forms a common electrical contact for the first semiconductor layer of the pixels and wherein the second semiconductor layer of the pixels is electrically conductively connected, by way of the second connection layer, to each one of the switches or wherein the second connection layer forms a common electrical contact for the first semiconductor layer of the pixels and wherein the first semiconductor layer of the pixels is electrically conductively connected, by way of the second connection layer, to each one of the switches.

12. The pixel headlight according to claim 1, wherein the active region extends contiguously across a plurality of the pixels.

13. The pixel headlight according to claim 1, wherein the active region is subdivided into a plurality of segments, each segment forming a pixel, wherein the segments arise from a common semiconductor layer sequence.

14. The pixel headlight according to claim 13, wherein the recess is one of a plurality of recesses that extend along a circumference of a segment.

15. The pixel headlight according to claim 13, wherein a side face of a segment comprises a projection extending parallel or substantially parallel to a radiation exit face of the pixel headlight, the first semiconductor layer being electrically contacted at the projection.

16. A method for producing a display device with a plurality of pixels, the method comprising:
providing a semiconductor layer sequence that comprises an active region provided for generating radiation;
forming a land on the semiconductor layer sequence for each pixel;
providing a carrier with a plurality of switches that are integrated into the carrier;
positioning the semiconductor layer sequence relative to the carrier such that a land is associated with each switch; and
producing an electrically conductive connection between the lands and the switches so that each switch is capable of controlling at least one pixel.

17. The method according to claim 16, further comprising removing a growth substrate for the semiconductor layer sequence.

18. The method according to claim 17, wherein the growth substrate is removed after the electrically conductive connection is produced.

19. A display device comprising:
a carrier; and
a semiconductor layer sequence having a major face facing the carrier, the semiconductor layer sequence comprising a first semiconductor layer, a second semiconductor layer, and an active region arranged between the first semiconductor layer and the second semiconductor layer, the active region adapted to generate radiation and form a plurality of pixels;
wherein the semiconductor layer sequence comprises a plurality of recesses that extend from the major face of the semiconductor layer sequence through the active region into the first semiconductor layer and are provided for electrical contacting of the first semiconductor layer;
wherein the carrier comprises a plurality of switches that are integrated into the carrier, each switch provided for controlling at least one pixel; and
wherein the display device is formed for a pixelated headlight.

20. A display device comprising:
a carrier; and
a semiconductor layer sequence having a major face facing the carrier, the semiconductor layer sequence comprising a first semiconductor layer, a second semiconductor layer, and an active region arranged between the first semiconductor layer and the second semiconductor layer, the active region adapted to generate radiation and form a plurality of pixels;
wherein the semiconductor layer sequence comprises a plurality of recesses that extend from the major face of the semiconductor layer sequence through the active region into the first semiconductor layer and are provided for electrical contacting of the first semiconductor layer;
wherein the carrier comprises a plurality of switches that are integrated into the carrier, each switch provided for controlling at least one pixel; and
wherein the active region extends contiguously across multiple pixels.

* * * * *